United States Patent
Zhu

(10) Patent No.: US 10,244,646 B2
(45) Date of Patent: Mar. 26, 2019

(54) FASTENING STRUCTURE OF DETACHABLE DOOR

(71) Applicant: Wistron Corporation, New Taipei (TW)

(72) Inventor: Chong-Xing Zhu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 207 days.

(21) Appl. No.: 15/146,913

(22) Filed: May 5, 2016

(65) Prior Publication Data
US 2017/0112008 A1    Apr. 20, 2017

(30) Foreign Application Priority Data

Oct. 15, 2015 (CN) .......................... 2015 1 0669583

(51) Int. Cl.
| E05D 7/12 | (2006.01) |
| G06F 1/18 | (2006.01) |
| H05K 5/02 | (2006.01) |
| H05K 7/14 | (2006.01) |
| H05K 9/00 | (2006.01) |

(52) U.S. Cl.
CPC .......... *H05K 5/0221* (2013.01); *G06F 1/182* (2013.01); *H05K 5/0226* (2013.01); *H05K 5/0239* (2013.01); *H05K 7/1488* (2013.01); *H05K 9/0062* (2013.01); *E05D 7/12* (2013.01)

(58) Field of Classification Search
CPC .. H05K 5/0221; H05K 5/0204; H05K 5/0217; H05K 5/0226; H05K 5/0239; E05D 7/12
See application file for complete search history.

(56) References Cited

U.S. PATENT DOCUMENTS

| 6,061,966 A | 5/2000 | Nelson et al. |
| 6,453,804 B1 | 9/2002 | Lee |
| 7,023,696 B2 * | 4/2006 | Ko .......................... G06F 1/20 |
| | | 165/121 |
| 8,641,313 B1 * | 2/2014 | Crippen ............... H05K 5/0221 |
| | | 361/679.39 |

(Continued)

FOREIGN PATENT DOCUMENTS

| CN | 2444263 Y | 8/2001 |
| CN | 200947193 Y | 9/2007 |

(Continued)

OTHER PUBLICATIONS

TIPO Office Action dated Feb. 12, 2018 in Taiwan application (No. 104136623).

(Continued)

*Primary Examiner* — Daniel J Rohrhoff
(74) *Attorney, Agent, or Firm* — McClure, Qualey & Rodack, LLP

(57) ABSTRACT

A fastening structure of a detachable door including at least one door and a fastener is provided. The fastener includes a fixing portion, a locking portion and a manual operation portion. The fixing portion is used to fix the fastener on at least one door. The locking portion is used to lock the at least one door onto a housing or unlock the at least one door from the housing. The manual operation portion is used to facilitate a user to move the at least one door under an installed state.

15 Claims, 14 Drawing Sheets

(56) References Cited

U.S. PATENT DOCUMENTS

| | | | | |
|---|---|---|---|---|
| 8,764,073 B2* | 7/2014 | Lin | ............... | E05B 17/002 |
| | | | | 277/637 |
| 9,658,655 B2* | 5/2017 | Yu | ............... | G06F 1/181 |
| 9,686,883 B2* | 6/2017 | Butterbaugh | ............... | H05K 7/1409 |

FOREIGN PATENT DOCUMENTS

| | | |
|---|---|---|
| CN | 201247440 Y | 5/2009 |
| CN | 203930633 U | 11/2014 |
| TW | M283484 | 12/2005 |
| TW | 201509269 A | 3/2015 |

OTHER PUBLICATIONS

CN Office Action dated Nov. 20, 2018 in Chinese application (No. 201510669583.1).

* cited by examiner

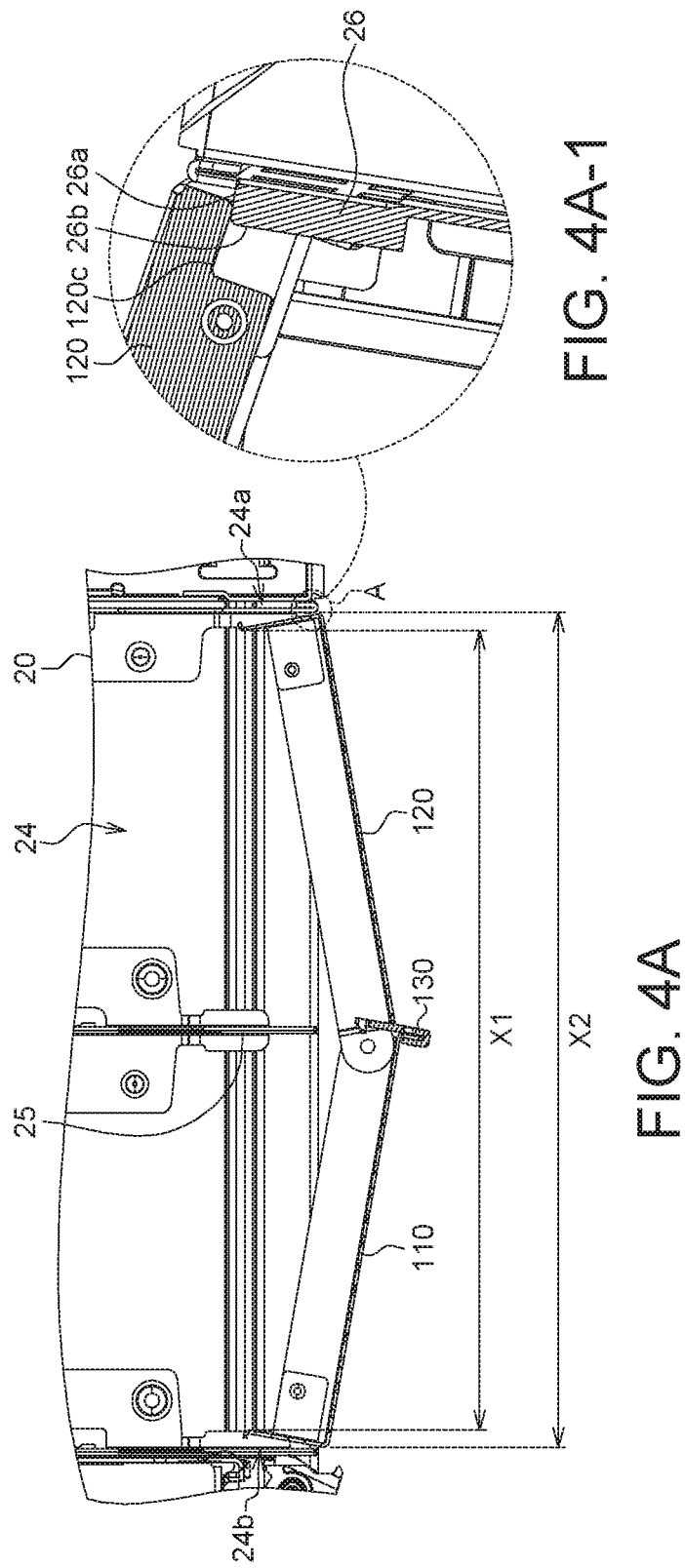

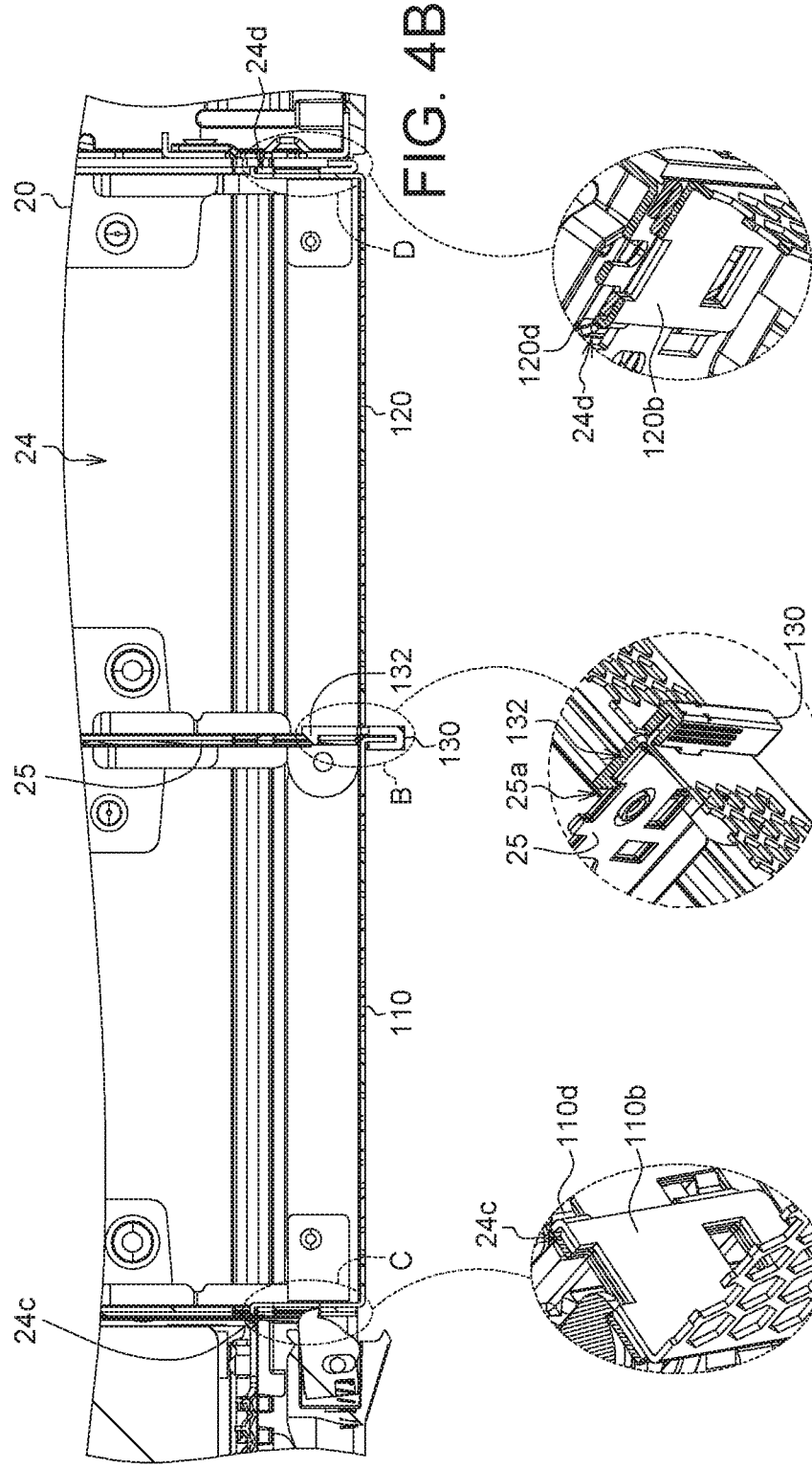

FASTENING STRUCTURE OF DETACHABLE DOOR

This application claims the benefit of People's Republic of China application Serial No. 201510669583.1, filed Oct. 15, 2015, the disclosure of which is incorporated by reference herein in its entirety.

TECHNICAL FIELD

The disclosure relates in general to a fastening structure, and more particularly to a fastening structure of a detachable door.

BACKGROUND

In a computer system, electrical devices such as a hard disc, a motherboard and a power supply are disposed inside the housing to avoid the radiation of electromagnetic waves affecting the normal operation of adjacent elements. To avoid an unused hard disc slot being exposed and causing the electrical devices in the housing under the interference of electromagnetic waves, a cartridge is normally inserted into the unused hard disc slot. Suppose four hard disc slots are not in use, the user would need to purchase four cartridges to interpose the four unused slots. This solution not only incurs additionally cost but also requires complicated operations of loading and unloading the cartridges, which is indeed very inconvenient.

SUMMARY

The disclosure is directed to a fastening structure of a detachable door to facilitate the mounting and dismounting of the detachable door.

According to one embodiment, a fastening structure of a detachable door including at least one door and a fastener is provided. The fastener includes a fixing portion, a locking portion and a manual operation portion. The fixing portion is used to fix the fastener on the at least one door. The locking portion is used to lock the at least one door onto a housing or unlock the at least one door from the housing. The manual operation portion is used for a user to move the at least one door under an installed state.

The above and other aspects of the present invention will become better understood with regard to the following detailed description of the preferred but non-limiting embodiment(s). The following description is made with reference to the accompanying drawings.

BRIEF DESCRIPTION OF THE DRAWINGS

FIG. 4A shows a schematic diagram of the fastening structure of a detachable door of FIG. 3A pre-installed on the housing.

FIG. 4A-1 shows an enlarged bottom view of a region A of FIG. 4A.

FIG. 4B shows a schematic diagram of a fastening structure of a detachable door installed on a housing.

FIG. 4B-1 shows an enlarged 3D diagram of a region B of FIG. 4B.

FIG. 4B-2 shows an enlarged 3D diagram of a region C of FIG. 4B.

FIG. 4B-3 shows an enlarged 3D diagram of a region D of FIG. 4B.

Figure 1:
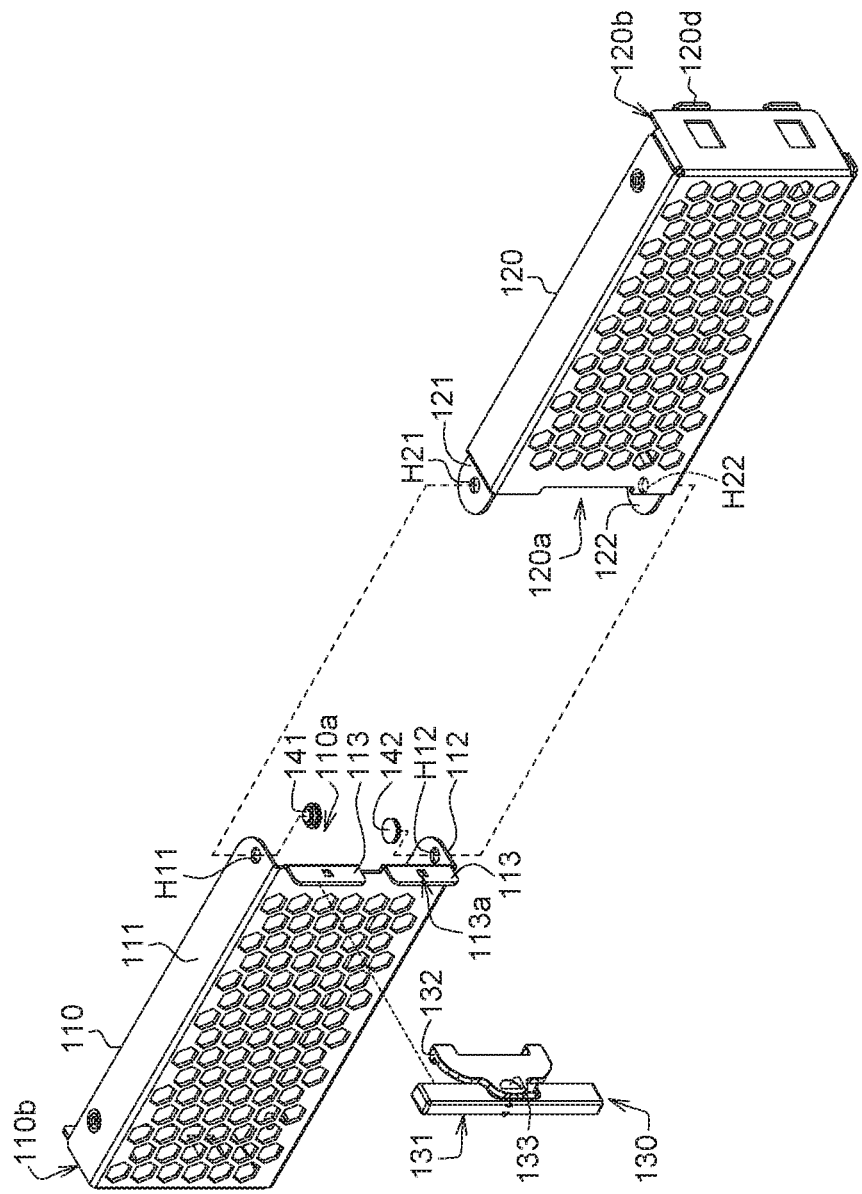
FIG. 1 shows a front view of a fastening structure of a detachable door under an un-installed state according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the present invention. However, the embodiments of the present invention are for detailed descriptions only, not for limiting the scope of protection of the present invention. Elements with identical or similar functions are denoted by identical or corresponding designations.

First Embodiment

Figure 2A:
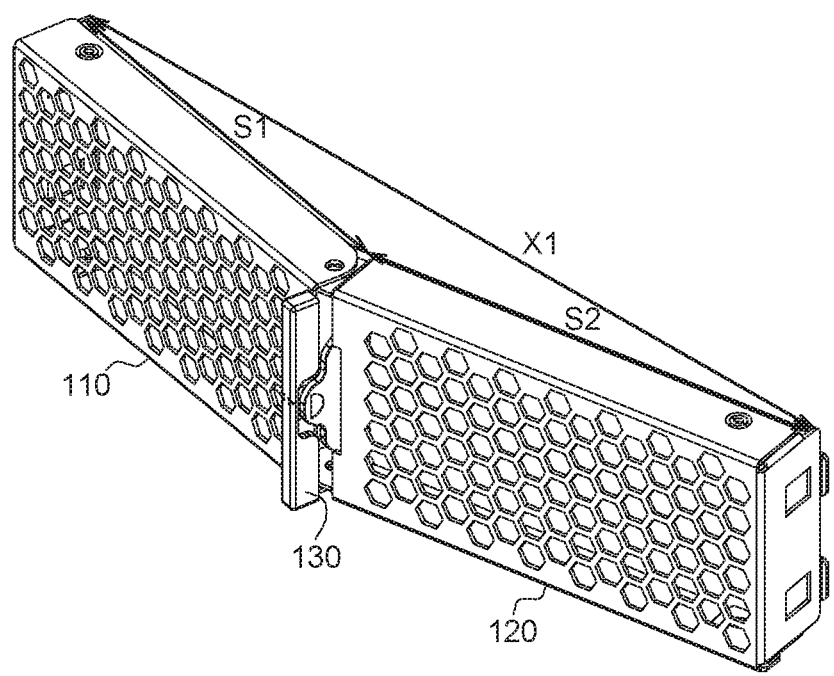
FIG. 2A shows a schematic diagram of a fastening structure of a detachable door under a pre-installed state according to an embodiment of the present invention.
Figure 2B:
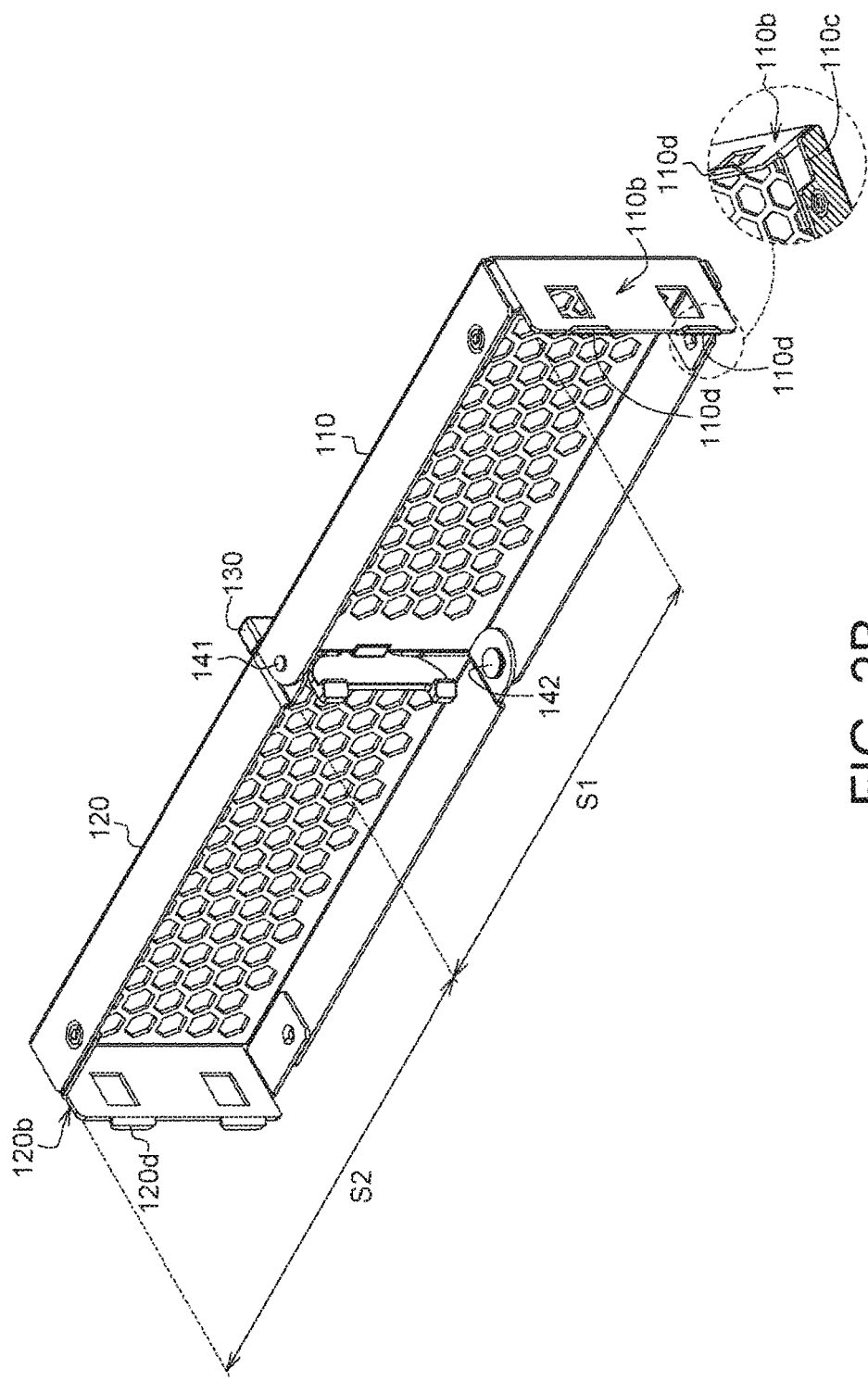
FIG. 2B shows a rear view and a local bottom view of a fastening structure of a detachable door according to an embodiment of the present invention.

Referring to FIG. 1, a schematic diagram of a fastening structure of a detachable door 100 according to an embodiment of the present invention is shown. The fastening structure of the detachable door 100 includes a first door 110, a second door 120, a fastener 130 and two pivoting members 141 and 142. The first door 110 and the second door 120 can be two rectangular perforated plates with U-shaped rims. An upper pivoting hole H11 and a lower pivoting hole H12 are formed on the two opposite rims 111 and 112 of the first door 110 respectively. Two tongue plates 121 and 122 are extended from the two opposite rims of the second door 120 and facing towards the two opposite rims 111 and 112 of the first door 110. An upper pivoting hole H21 and a lower pivoting hole H22 are formed on the two tongue plates 121 and 122 respectively. The two upper pivoting holes H11 and H21 corresponding to each other are assembled by the first pivoting member 141. The two lower pivoting holes H12 and H22 corresponding to each other are assembled by the second pivoting member 142. The first door 110 and the second door 120 are assembled to form a rectangular perforated plate with closed rims as illustrated in FIG. 2A and FIG. 2B. However, the present invention is not limited to the above exemplification, and the first door 110 and the second door 120 can be also assembled to form other types of perforated plates. The perforated plate is merely an exemplary example of the first door 110 and the second door 120. In some embodiments, the first door 110 and the second door 120 are not necessarily realized by perforated plates. Instead, the first door 110 and the second door 120 can be realized by a door with a single opening, multiple openings or without any opening as long as the door is capable of shielding interference of electromagnetic waves. The first door 110 and the second door 120 are preferably made of metal or conductive material, but the present invention is not limited thereto.

The first pivoting member 141 is a hinge penetrating the upper pivoting hole H11 of the first door 110 and the upper pivoting hole H21 of the second door 120. The second pivoting member 142 is another hinge penetrating the lower pivoting hole H12 of the first door 110 and the lower pivoting hole H22 of the second door 120. The first pivoting member 141 and the second pivoting member 142 are located on the same axis, such that the first door 110 and the second door 120 can rotate with respect to each other around the two pivoting members 141 and 142 and the second door 120 can be moveably pivoted to the first door 110. The two pivoting members 141 and 142 after assembly are illustrated in FIGS. 2A and 2B.

In an embodiment, the above pivoting members can be replaced by a hinge whose one end penetrates the upper pivoting hole H11 of the first door 110 and the upper pivoting hole H21 of the second door 120 and the other end penetrates the lower pivoting hole H12 of the first door 110 and the lower pivoting hole H22 of the second door 120. Thus, the present invention is not limited to the two pivoting members 141 and 142 of FIG. 1.

In an embodiment, the opening end 110a of the first door 110 and the opening end 120a of the second door 120 are adjacent to each other and located between the first door 110 and the second door 120, and the closed end 110b of the first door 110 and the closed end 120b of the second door 120 are separated by a distance and located at two opposite ends of the first door 110 and the second door 120. In the first door 110, a plug-in member 113 is disposed at a lateral side of the opening end 110a. The plug-in member 113 is protruded towards the fastener 130 and engaged with the fastener 130 to fix the fastener 130 at the lateral side of the opening end 110a of the first door 110, such that the fastener 130 can be disposed between the first door 110 and the second door 120. The fastener 130 after assembly is as illustrated in FIGS. 2A and 2B.

Refer to FIGS. 2A and 2B. FIG. 2A shows a schematic diagram of a fastening structure of a detachable door 100 under a pre-installed state according to an embodiment of the present invention. FIG. 2B shows a rear view and a local bottom view of a fastening structure of a detachable door 100 according to an embodiment of the present invention. As indicated in FIG. 2B, the first door 110 has a first length S1, the second door 120 has a second length S2, and the total length of the first door 110 and the second door 120 is S1+S2. That is, the straight line distance between two opposite ends (two closed ends 110b and 120b) of the first door 110 and the second door 120 under a straightened state is equivalent to the total length S1+S2 of the first door 110 and the second door 120. As indicated in FIG. 2A, the first door 110 has the first length S1, and the second door 120 has the second length S2. When the first door 110 and the second door 120 do not maintain the straighten state (that is, when the first door 110 and the second door 120 intersect at a V shape), the straight line distance X1 between two opposite ends of the first door 110 and the second door 120 will be smaller than the total length S1+S2 of the first door 110 and the second door 120.

In an embodiment, the straight line distance between two opposite ends of the first door 110 and the second door 120 is reduced, such that the first door 110 and the second door 120 can be pre-installed in an open slot 24 of the housing 20. As indicated in FIG. 3A and FIG. 4A, the straight line distance X1 between two opposite ends of the first door 110 and the second door 120 under a pre-installation state is lightly smaller than the distance X2 between two opposite sides 24a and 24b of an open slot 24 of the housing 20, such that the first door 110 and the second door 120 can be pre-installed in the open slot 24 of the housing 20.

In an embodiment, a force is applied onto the first door 110 and the second door 120 (for example, a force is applied to straighten the first door 110 and the second door 120), such that the straight line distance between two opposite ends 110b and 120b of the first door 110 and the second door 120 is increased to the total length S1+S2 of the first door 110 and the second door 120, and the first door 110 and the second door 120 is engaged in an open slot 24 of the housing 20. As indicated in FIG. 3B and FIG. 4B, under an installed state, the straight line distance between two opposite ends 110b and 120b of the first door 110 and the second door 120 is equivalent to the distance between two opposite sides 24a and 24b of the open slot 24 of the housing 20, such that the first door 110 and the second door 120 can be tightly engaged in the open slot 24.

Figure 3A:
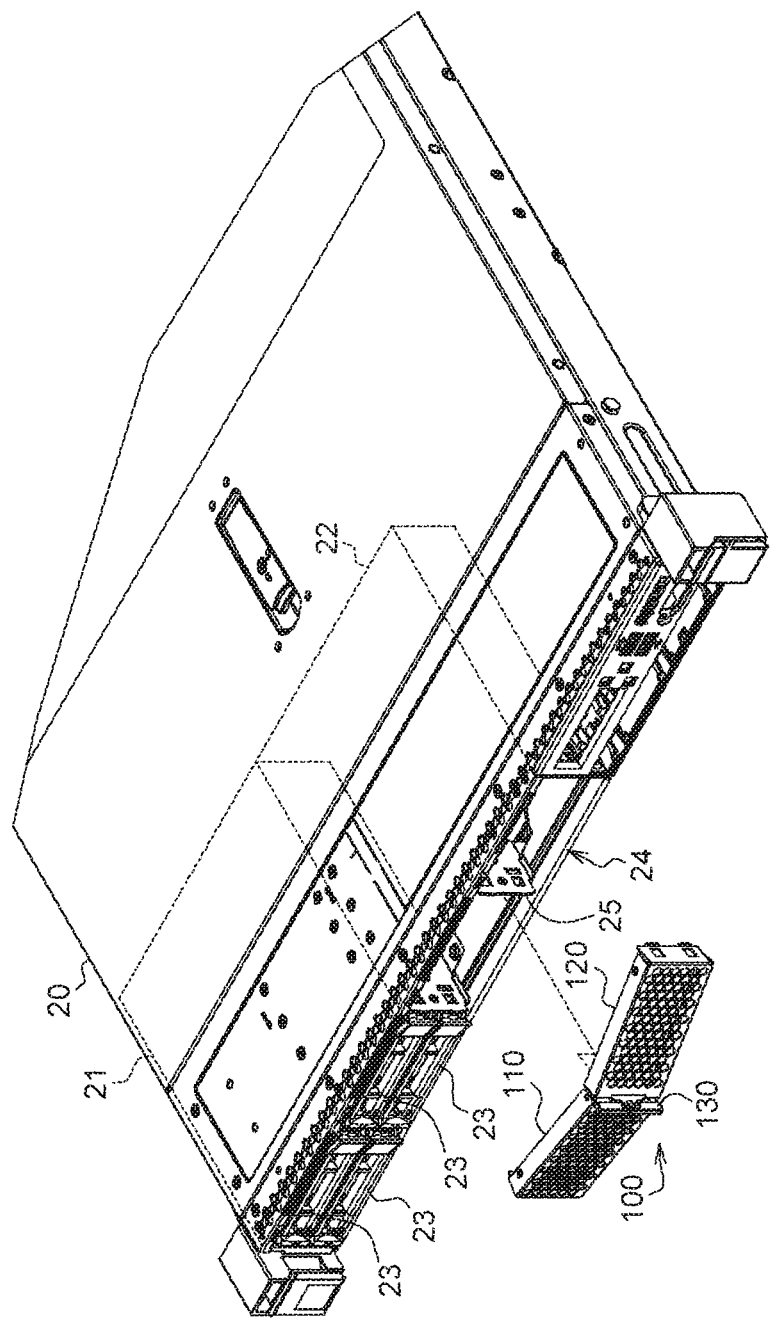
FIG. 3A shows a schematic diagram of a fastening structure of a detachable door before being pre-installed on a housing according to an embodiment of the present invention.
Figure 3B:
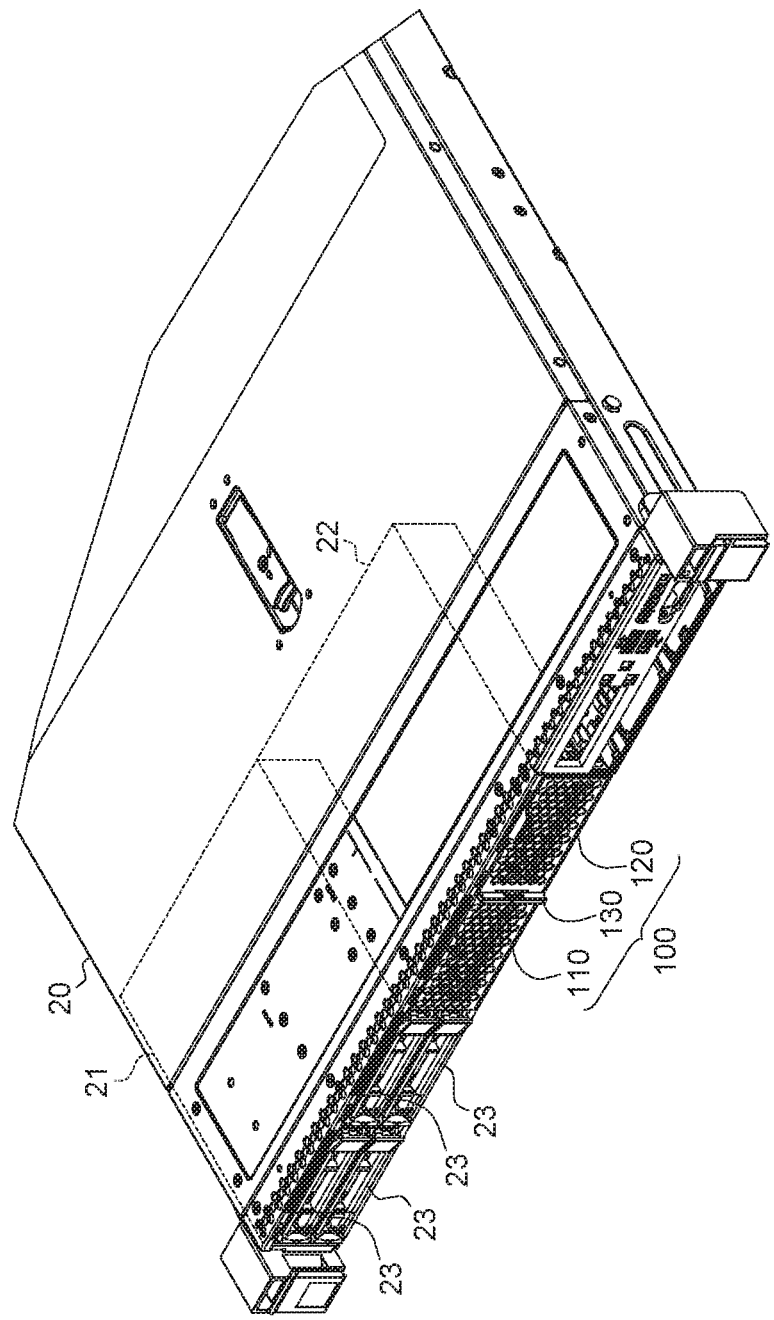
FIG. 3B shows a schematic diagram of a fastening structure of a detachable door installed on a housing.

Refer to FIGS. 3A and 3B. FIG. 3A shows a schematic diagram of a fastening structure of a detachable door 100 before being pre-installed on a housing 20 according to an embodiment of the present invention. FIG. 3B shows a schematic diagram of a fastening structure of a detachable door 100 installed on a housing 20. The housing 20, such as a housing of a server or a computer, has a first set of hard disc slots 21 and a second set of hard disc slots 22. Four or other quantity of removable hard discs 23 are installed in the first set of hard disc slots 21 respectively, but the second set of hard disc slots 22 is not used and forms a larger open slot 24. As indicated in FIG. 3A, the first door 110 covers an area of two slots for receiving hard discs, and the second door 120 covers an area of two slots for receiving hard discs. In an embodiment, the housing 20 has a division plate 25 disposed in the open slot 24 for dividing the open slot 24 into two equal parts. The division plate 25 is an existing part on the body of the second set of hard disc slots 22, and does not need to be additionally disposed. Therefore, through the division plate 25, the first door 110 and the second door 120 can be locked into or unlocked from the open slot 24 by the fastener 130 of the present embodiment.

Refer to FIGS. 4A and 4A-1. FIG. 4A shows a schematic diagram of the fastening structure of the detachable door 100 of FIG. 3A pre-installed on the housing 20. FIG. 4A-1 shows an enlarged bottom view of a region A of FIG. 4A. In an embodiment, the housing 20 has a stopper 26 disposed on each of the two opposite sides of the open slot 24 (only one stopper is illustrated in the diagram). The stopper 26 leans on a bottom side 110c of the first door 110 and the second door 120 under a pre-installation state, such that the first door 110 and the second door 120 can be positioned in the open slot 24. As indicated in FIG. 4A-1, the stopper 26, such as a plate inside the housing 20, has a short side 26a and a long side 26b extended inwards from two opposite sides of the open slot 24. The short side 26a of the plate contacts a bottom side 120c of the second door 120 to restrict the movement of the second door 120 towards a depth direction of the open slot 24 (corresponding to the long side 26b of the plate). Since the short side 26a of the stopper 26 and the bottom side 120c of the second door 120 are not locked in horizontal displacement, the second door 120 still can move horizontally along the short side 26a of the stopper 26 until the first door 110 and the second door 120 are straightened and maintain an installed state as indicated in FIG. 4B. In FIG. 2B, the bottom side 110c of the first door 110 and another stopper (not illustrated in the diagram) have similar actuations, and the similarities are not repeated here.

Refer to FIGS. 4B, 4B-1, 4B-2 and 4B-3. FIG. 4B shows a schematic diagram of a fastening structure of a detachable door 100 installed on a housing 20. FIG. 4B-1 shows an enlarged 3D diagram of a region B of FIG. 4B. FIG. 4B-2 shows an enlarged 3D diagram of a region C of FIG. 4B. FIG. 4B-3 shows an enlarged 3D diagram of a region D of FIG. 4B. In an embodiment, two opposite ends 110b and 120b of the first door 110 and the second door 120 respectively have a first clamping member 110d and a second clamping member 120d protruded towards the inner wall of the open slot 24, and the inner wall of the open slot 24 has a first clamping groove 24c and a second clamping groove 24d respectively corresponding to the first clamping member 110d and the second clamping member 120d as indicated in FIG. 4B-2 and FIG. 4B-3. Therefore, when the first door 110 and the second door 120 are straightened and pushed along the depth direction of the open slot 24, the first clamping member 110d is engaged with the first clamping groove 24c, and the second clamping member 120d is engaged with the second clamping groove 24d, such that the first door 110 and the second door 120 can be tightly engaged in the open slot 24.

As indicated in FIG. 4B-1, the locking portion 132 of the fastener 130 has a hook protruded towards the division plate 25 of the housing 20, and the division plate 25 has a clamping groove 25a corresponding to the locking portion 132. Therefore, when the first door 110 and the second door 120 are straightened and pushed along the depth direction of the open slot 24, the locking portion 132 is engaged with the clamping groove 25a, such that the fastener 130 can be fastened on the division plate 25.

Figure 5A:
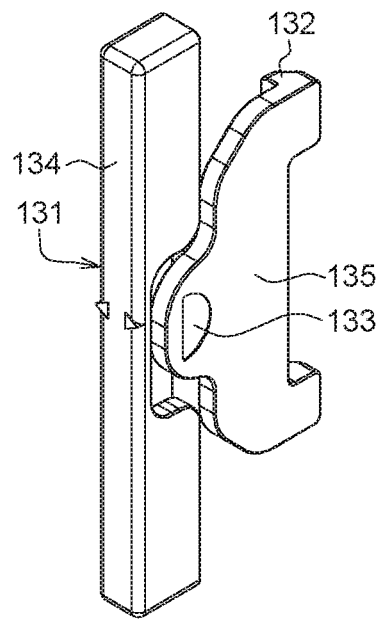
FIGS. 5A and 5B respectively are a front view and a rear view of a fastener according to an embodiment of the present invention.
Figure 5B:
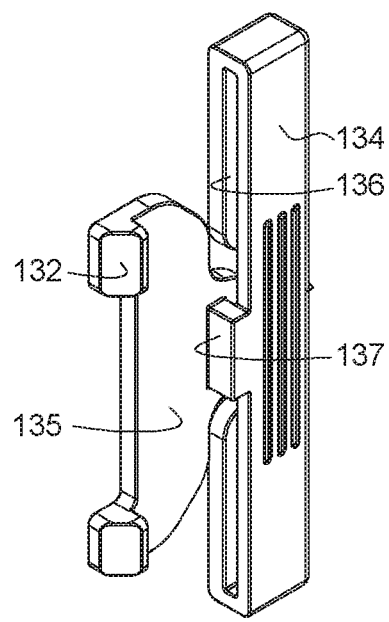
Figure 5C:
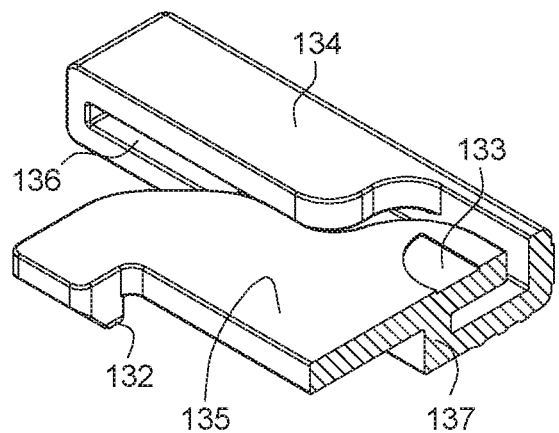
FIGS. 5C and 5D respectively are a vertical cross-sectional view and a horizontal cross-sectional view of a fastener.
Figure 5D:
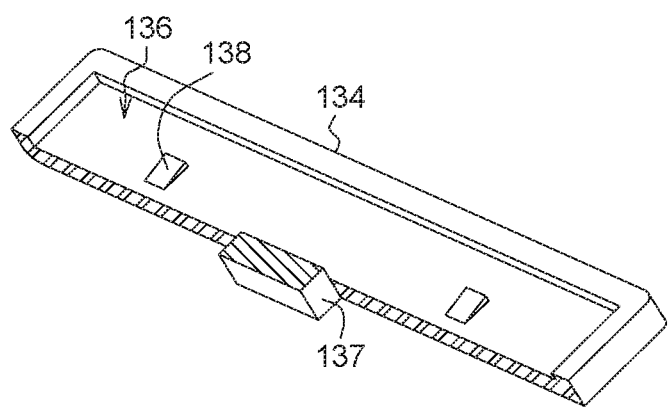

Refer to FIGS. 5A, 5B, 5C and 5D. FIGS. 5A and 5B respectively are a front view and a rear view of a fastener 130 according to an embodiment of the present invention. FIGS. 5C and 5D respectively are a vertical cross-sectional view and a horizontal cross-sectional view of a fastener 130. In an embodiment, the fastener 130 includes a fixing portion 131, a locking portion 132 and a manual operation portion 133. As indicated in FIGS. 5A and 5B, the fixing portion 131 includes a pillar body 134, a tabular body 135 and at least one clamping groove 136. The tabular body 135 connects the pillar body 134 through a fixed fulcrum 137. The locking portion 132 and the manual operation portion 133 are located at two opposite sides of the tabular body 135. Besides, the fixed fulcrum 137 is located between the locking portion 132 and the manual operation portion 133, such that the locking portion 132 and the manual operation portion 133 can perform a lever movement with respect to the fixed fulcrum 137. As indicated in FIG. 5C, when the user presses the manual operation portion 133, the tabular body 135 can perform a lever movement using the fixed fulcrum 137 as the fulcrum, such that the locking portion 132 can rotate with respect to the fixed fulcrum 137. As indicated in FIG. 5D, the clamping groove 136 extends along the pillar body 134 of the fixing portion 131, and at least one hook 138 is disposed in the clamping groove 136.

As indicated in FIG. 1, the first door 110 has at least one plug-in member 113 protruded towards the clamping groove 136 of FIG. 5D, and the plug-in member 113 has at least one clamping groove 113a corresponding to the hook 138 in the clamping groove 136. When the plug-in member 113 is inserted into the clamping groove 136, the hook 138 is engaged with the clamping groove 113a, such that the pillar body 134 of the fixing portion 131 can be fixed on the first door 110.

Figure 6:
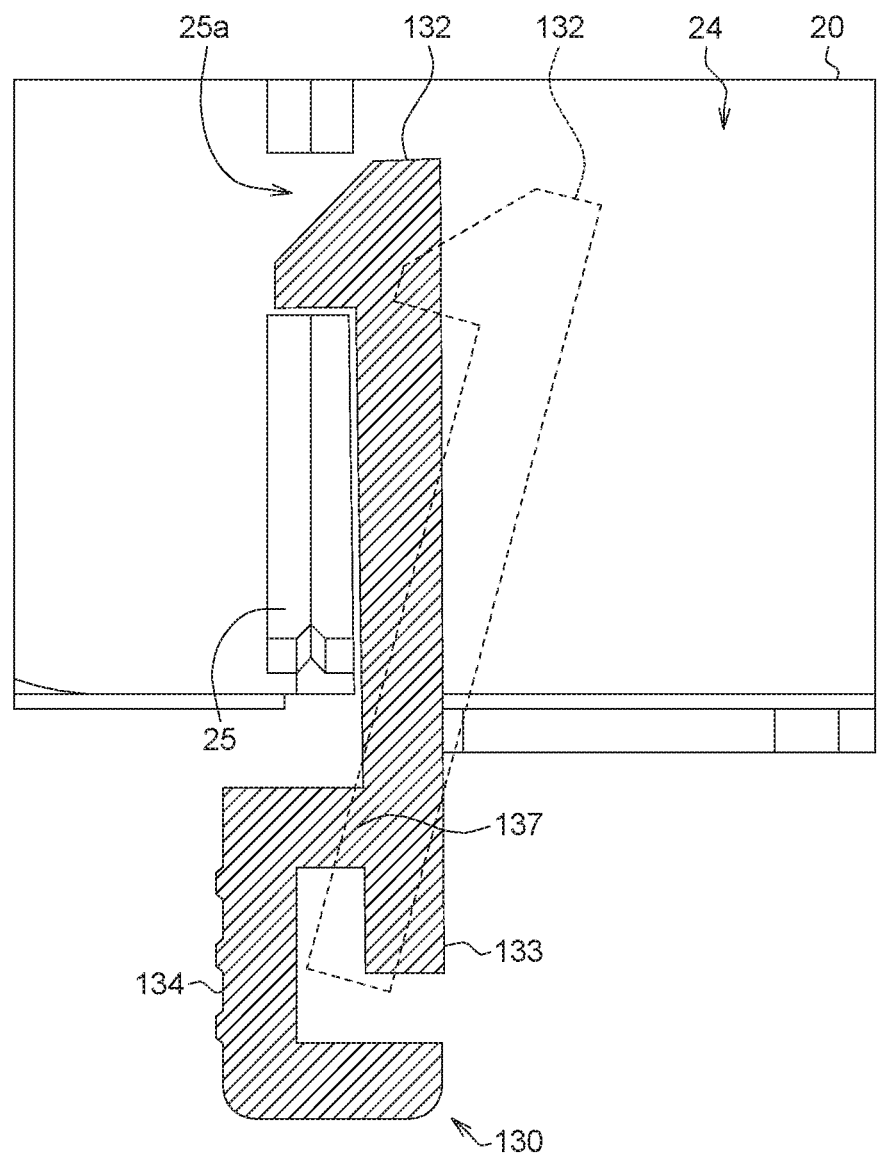
FIG. 6 shows an actuation diagram of a locking portion of a fastener.

Referring to FIG. 6, an actuation diagram of a locking portion 132 of a fastener 130 is shown. Under an installed state, the locking portion 132 is engaged with the division plate 25 of the housing 20 as indicated in solid lines. When the user presses the manual operation portion 133, the locking portion 132 and the manual operation portion 133 perform a lever movement with respect to the fixed fulcrum 137, such that the locking portion 132 can rotate with respect to the fixed fulcrum 137 and unlock from the housing 20 as indicated in dotted lines. It should be noted that when the locking portion 132 is under an unlocked state, the user can press the manual operation portion 133 and the pillar body 134, and then pull out the first door 110 and the second door 120 under an installed state to dismount the doors with one single hand. The user can also mount the doors with one single hand without using any tools.

In the above embodiment, apart from fixing the fastener 130 on the first door 110, the pillar body 134 can further collaborate with the manual operation portion 133 for the user to conveniently apply a force (push or pull) to push the first door 110 and the second door 120 into the housing 20 or pull the first door 110 and the second door 120 from the housing 20 with one single hand. In an embodiment, the manual operation portion 133 can be used alone, and does not have to be used together with the pillar body 134. When the manual operation portion 133 is used alone, the user still can mount or dismount the doors with one single hand as long as the holding point has a sufficient area for the user.

As disclosed in above embodiments, the fixing portion 131 is used to fix the fastener 130 on the first door 110. The locking portion 132 is used to lock the first door 110 and the second door 120 onto a housing 20 or unlock the first door 110 and the second door 120 from the housing 20. The manual operation portion 133 is for the user to conveniently push the first door 110 and the second door 120 under a pre-installation state into the housing 20 or move the first door 110 and the second door 120 under an installed state from the housing 20.

Different types and implementations of fasteners are described below.

Second Embodiment

Figure 7A:
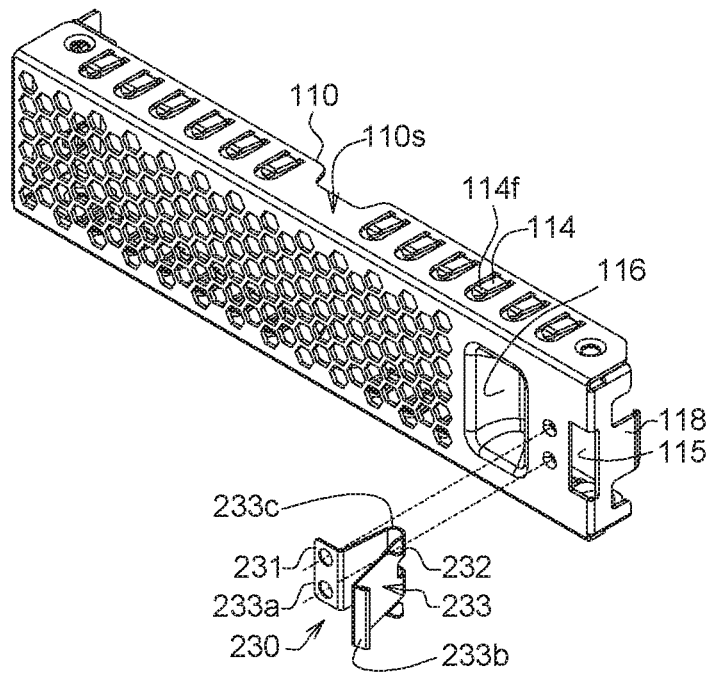
FIG. 7A shows a decomposition diagram of a fastening structure of a detachable door according to an embodiment of the present invention.
Figure 7B:
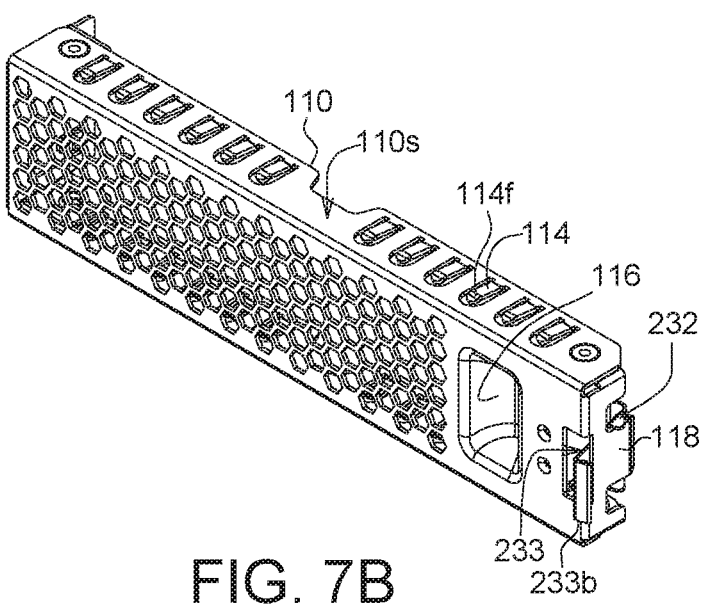
FIG. 7B shows an assembly diagram of the fastening structure of a detachable door of FIG. 7A.

Refer to FIGS. 7A and 7B. FIG. 7A shows a decomposition diagram of a fastening structure of a detachable door 101 according to an embodiment of the present invention. FIG. 7B shows an assembly diagram of the fastening structure of the detachable door 101 of FIG. 7A. FIG. 7A illustrates a first door 110 and a fastener 130 disposed on the first door 110 are Illustrated, but not the second door 120 of FIG. 1. That is, the fastening structure illustrated in FIG. 7A can be implemented with one single detachable door, and the length of the first door 110 is equivalent to the length of the open slot. That is, the first door 110 covers an area of four slots for receiving hard discs. Or, a second door 120 can be added to the fastening structure of FIG. 7A to form a fastening structure composed of two detachable doors. The pivoting manner of the first door 110 and the second door 120 is already disclosed in the first embodiment, and related descriptions can be obtained with reference to the first embodiment. Similarities are not repeated here, and only dissimilarities are disclosed below.

In an embodiment, the fastener 230 includes a fixing portion 231, a locking portion 232 and a manual operation portion 233. The fastener 230 can be formed by a U-shaped elastomer. The fixing portion 231 is located at a terminal end 233a of the U-shaped elastomer for fixing the U-shaped elastomer on the first door 110. In some embodiments, the fixing portion 231 can be fixed on the first door 110 by way of rivets, screws, welding or locking. In the present embodiment, although the fastener 230 is not fixed on the first door 110 using the pillar body 134, the fixing portion 231 can be designed with reference to the pillar body 134 for the user to conveniently apply a force (pull or push).

The locking portion 232 is located at a bottom end 233c of the U-shaped elastomer (the fastener 230) and leans on a side plate 118 of the first door 110. The locking portion 232 has a hook protruded outside the U-shaped elastomer. Details of the engagement of the locking portion 132 and the division plate 25 of the housing 20 are already described in the first embodiment, and thus the engagement of the locking portion 232 and the division plate 25 are not repeated here. In the present embodiment, although the locking portion 232 does not rotate with respect to the fixed fulcrum 137 through a lever movement in the first embodiment, the locking portion 232 still can rotate with respect to the fixing portion 231 through the extension and contraction of the U-shaped elastomer (the fastener 230).

Refer to FIG. 7B. The fastener 230 is disposed in the opening 115 of the first door 110 (the opening 115 can be replaced by a gap between the first door 110 and the second door 120 in the first embodiment), and another terminal end 233b of the U-shaped elastomer is protruded outside the opening 115 for the user to conveniently apply a force. In an embodiment, when the user presses another terminal end 233b of the U-shaped elastomer (that is, the manual operation portion 233), the fixing portion 231 is used as a resistance point against the force applied by the user, and the locking portion 232 can move with respect to the fixing portion 231 and be unlocked from the housing. Refer to FIG. 7B. A recess 116 can further be disposed on the first door 110. The recess 116 is adjacent to the fastener 230, and can further be used as an auxiliary holding point for the user to press the fastener 230. It should be noted that when the locking portion 232 is under an unlocked state, the user can press the fastener 230 and the recess 116, and then pull out the first door 110 (or the first door 110 and the second door 120) under an installed state to dismount the doors with one single hand without using any tools. Similarly, the user can also mount the doors with one single hand without using any tools.

Refer to FIGS. 7A and 7B. In an embodiment, a plurality of first elastomers 114 are disposed on the side surface 110s of the first door 110 (such as the upper rim 111 and/or the lower rim 112 of the first door 110). Each first elastomer 114 can be formed by a cantilever elastomer whose one end is a fixed end and the other end is a free end 114f. The height of the free end 114f is slightly higher than the height of the fixed end. Although the second door 120 is not illustrated in the present embodiment, a plurality of second elastomers can be disposed on the side surface of the second door 120 of FIG. 1 (such as the upper rim and/or the lower rim of the second door 120). Each second elastomer can be formed by a cantilever elastomer whose one end is a fixed end and the other end is a free end whose height is slightly higher than the height of the fixed end. As indicated in FIG. 3B, when the first door 110 and the second door 120 adopt elastomer designs and are disposed in the open slot 24 of the housing 20, the first elastomer 114 will be fixed in the gap between the housing 20 and the first door 110, and the second elastomer will be fixed in the gap between the housing 20 and the second door 120. Thus, the first door 110 and the second door 120 can be tightly engaged in the open slot 24 without using the first clamping member 110d and the second clamping member 120d which are disposed at two opposite ends of the first door 110 and the second door 120.

Also, the first door 110 and the second door 120 adopting the said elastomer designs are capable of reducing the amount of electromagnetic waves leaking outwards through door gaps or entering the housing 20, and effectively inhibiting interference of electromagnetic waves.

Figure 8A:
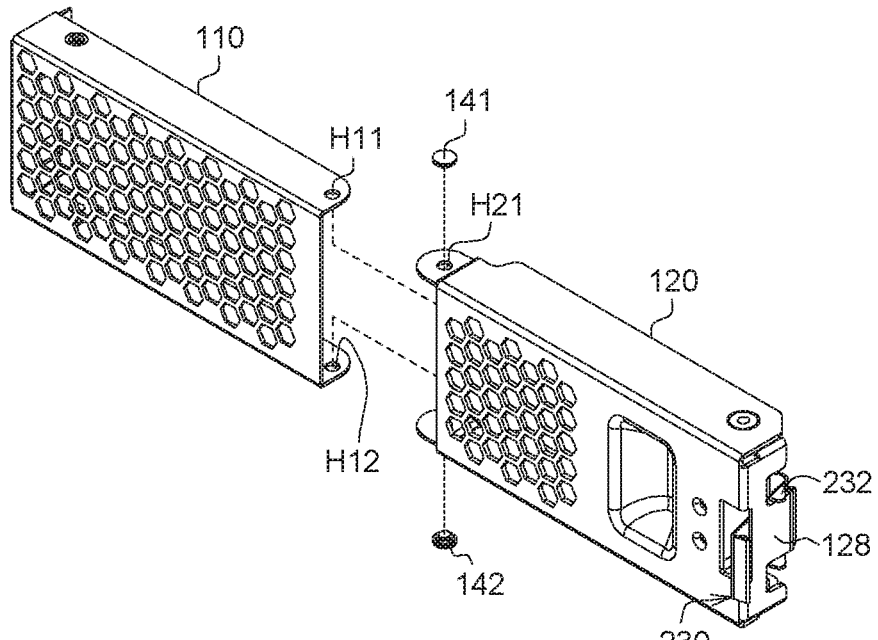
FIGS. 8A and 8B respectively are a decomposition diagram and an assembly diagram of a fastening structure of a detachable door according to an embodiment of the present invention.
Figure 8B:
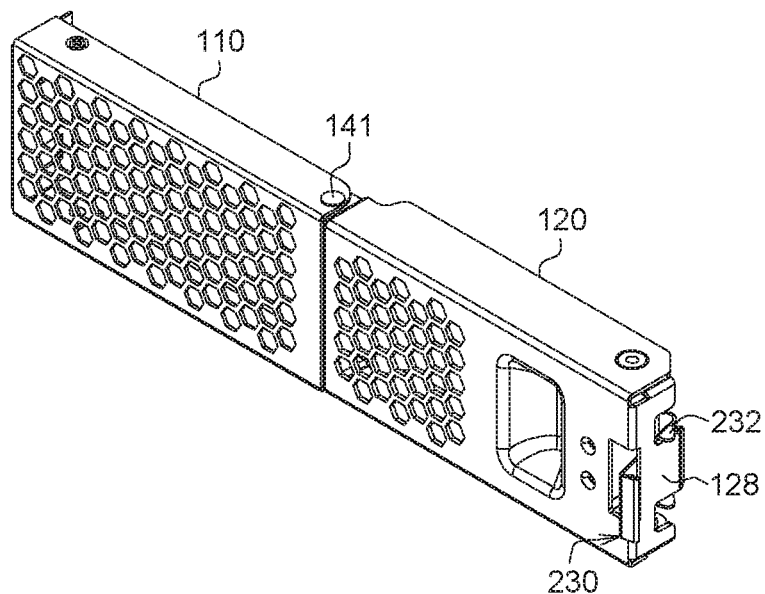
Figure 8C:
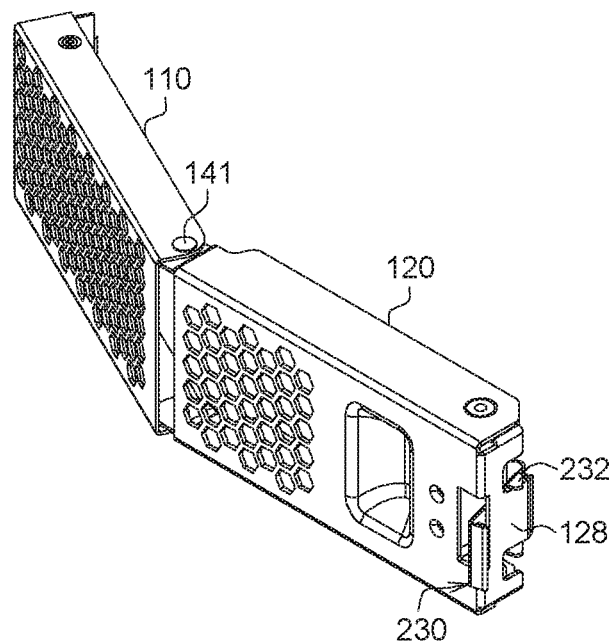
FIG. 8C shows a schematic diagram of a fastening structure of a detachable door under a pre-installed state according to an embodiment of the present invention.

Refer to FIGS. 8A-8C. The fastening structure of a detachable door 102 of another embodiment includes the first door 110 and the second door 120 pivoted to each other, and is different from the fastening structure of a detachable door 101 in that the first pivoting member 141 penetrates the upper pivoting hole H11 of the first door 110 and the upper pivoting hole H21 of the second door 120 and the second pivoting member 142 penetrates the lower pivoting hole H12 of the first door 110 and the lower pivoting hole H22 of the second door 120. Details of the pivoting manner of the first door 110 and the second door 120 are already disclosed in the first embodiment and will not be repeated here. Moreover, the fastener 230 can be formed by a U-shaped elastomer, and the locking portion 232 is located at a bottom end of the U-shaped elastomer and leans on a side plate 128 of the second door 120. When the fastener 230 is unlocked, the first door 110 and the second door 120 pivoted to each other can be moved at the same time. Details of the operation of the fastener 230 can be obtained with reference to paragraphs [0045] to [0047], and are not repeated here.

Refer to FIG. 8C. After the first door 110 and the second door 120 under a pre-installation state are straightened, the locking portion 232 can be fastened on the housing 20 of FIG. 3A to provide a function similar to that provided by the second clamping member 120d of the second door 120 in the first embodiment. Thus, the open slot 24 of the housing 20 can be dispensed without the division plate 25 which is used for locking the locking portion.

Third Embodiment

Figure 9A:
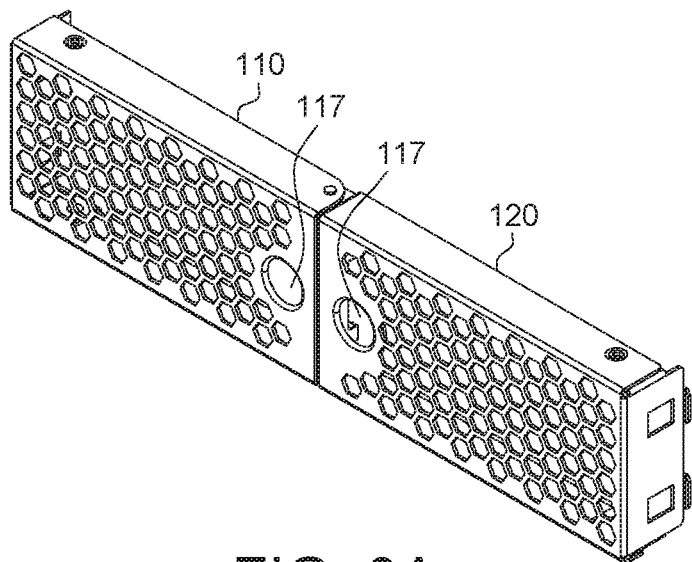
FIGS. 9A and 9B respectively are a front view and a rear view of a fastening structure of a detachable door according to an embodiment of the present invention.
Figure 9B:
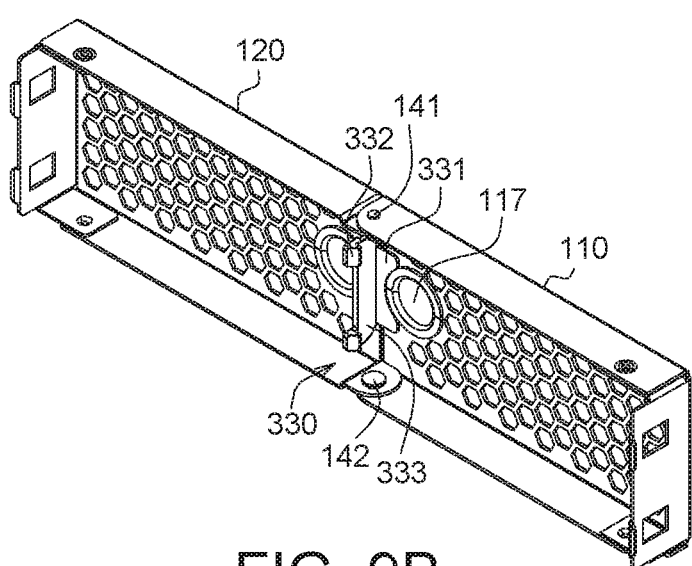

Refer to FIGS. 9A and 9B. FIGS. 9A and 9B respectively are a front view and a rear view of a fastening structure of a detachable door 103 according to an embodiment of the present invention. Since the fastener 330 is disposed on rear surfaces of the first door 110 and the second door 120, only the at least one operating window 117 (or two operating windows 117) through which the user can insert his/her finger to flip the fastener 330 are illustrated in the front view of FIG. 9A. As indicated in FIG. 9B, the fastener 330 includes a fixing portion 331, a locking portion 332 and a manual operation portion 333. The manual operation portion 333 can be formed by a plate connected between the fixing portion 331 and the locking portion 332. That is, the fixing portion 331 and the locking portion 332 are located on two opposite sides of the plate (the manual operation portion 333).

The fixing portion 331 can be fixed on the first door 110 by way of rivets, screws, welding or locking. The locking portion 332 can rotate with respect to the fixing portion 331 through the rotation of the plate (the manual operation portion 333).

In an embodiment, when the user applies a force to flip the plate (the manual operation portion 333), the fixing portion 331 is used as a fixed fulcrum, such that the locking portion 332 can move with respect to the fixing portion 331 and be unlocked from the housing like the locking portion 132 of FIG. 6.

According to the fastening structure of the detachable door disclosed in above embodiments of the present invention, at least one door is locked on or unlocked from the housing through the fastener disposed on the at least one door. The fastener is easy to operate and can be mounted or dismounted with one single hand. Therefore, the fastening structure of the detachable door of the present invention is capable of resolving the problems associated with the conventional solution which needs to purchase many cartridges to interpose the unused hard disc slots, not only incurring additional cost but also involving complicated operations of loading and unloading the cartridges.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A fastening structure of a detachable door, comprising:
a first door;
a second door moveably pivoted to the first door; and
a fastener, comprising a fixing portion, a locking portion and a manual operation portion, wherein the fixing portion is used to fix the fastener on the at least one door, the locking portion is used to lock the at least one door onto a housing or unlock the at least one door from the housing, and the manual operation portion is used to facilitate a user to move the at least one door under an installed state.

2. The fastening structure of a detachable door according to claim 1, wherein the manual operation portion is used to facilitate the user to push the first door and the second door under a pre-installation state into the housing.

3. The fastening structure of a detachable door according to claim 2, wherein a straight line distance between two opposite ends of the first door and the second door intersecting at a V shape under the pre-installation state is smaller than a straight line distance between the two opposite ends of the first door and the second door straightened under the installed state.

4. The fastening structure of a detachable door according to claim 3, wherein a straight line distance between two opposite ends of the first door and the second door straightened under the installed state is equivalent to a distance between two opposite sides of an open slot of the housing, such that the first door and the second door is tightly engaged in the open slot.

5. The fastening structure of a detachable door according to claim 4, wherein two opposite ends of the first door and the second door respectively have a clamping member protruded towards an inner wall of the open slot, such that the first door and the second door is tightly engaged in the open slot after the first door and the second door are straightened and pushed into the open slot.

6. The fastening structure of a detachable door according to claim 4, wherein the housing has a division plate disposed in the open slot, and the locking portion has a hook protruded towards the division plate, such that the fastener is fastened on the division plate via the hook.

7. The fastening structure of a detachable door according to claim 2, wherein a straight line distance between two opposite ends of the first door and the second door under a pre-installation state is smaller than a distance between two opposite sides of an open slot of the housing, such that the first door and the second door is pre-installed in the open slot of the housing.

8. The fastening structure of a detachable door according to claim 7, wherein the housing has two stoppers disposed on two opposite sides of the open slot and leaning on a bottom side of the first door and the second door under the pre-installation state, such that the first door and the second door is positioned in the open slot.

9. The fastening structure of a detachable door according to claim 1, wherein the fixing portion comprises at least one clamping groove, and the first door has at least one plug-in member protruded towards the at least one clamping groove, and the at least one plug-in member is inserted into the at least one clamping groove.

10. The fastening structure of a detachable door according to claim 9, wherein the fixing portion comprises a fixed fulcrum located between the manual operation portion and the locking portion, and when the user presses the manual operation portion, the fixed fulcrum is used as a fulcrum against the force applied on the manual operation portion by the user, such that the locking portion rotates with respect to the fixed fulcrum and unlocks from the housing.

11. The fastening structure of a detachable door according to claim 1, wherein side surfaces of the first door and the second door respectively have at least one first elastomer and at least one second elastomer, the first elastomer fixes in a gap between the housing and the first door, and the second elastomer fixes in a gap between the housing and the second door.

12. The fastening structure of a detachable door according to claim 1, wherein the fastener is connected between the first door and the second door, and the fixing portion is used as a fixed fulcrum through which the manual operation portion is flipped, such that the locking portion rotates with respect to the fixing portion and unlocks from the housing.

13. The fastening structure of a detachable door according to claim 12, wherein at least one of the first door and the second door have at least one operating window through which the fastener inside the at least one of the first door and the second door is flipped, such that the locking portion rotates with respect to the fixing portion.

14. A fastening structure of a detachable door, comprising:
at least one door; and
a fastener, comprising a fixing portion, a locking portion and a manual operation portion, wherein the fixing portion is used to fix the fastener on the at least one door, the locking portion is used to lock the at least one door onto a housing or unlock the at least one door from the housing, and the manual operation portion is used to facilitate a user to move the at least one door under an installed state, wherein the fastener is a U-shaped elastomer, the fixing portion is located at a terminal end of the U-shaped elastomer, the locking portion is located at a bottom end of the U-shaped elastomer and leans on a side plate of the at least one door, and the fixing portion is used as a resistance point against a force applied on another terminal end of the U-shaped elastomer by the user, such that the locking portion rotates with respect to the fixing portion and unlocks from the housing.

15. The fastening structure of a detachable door according to claim 14, wherein the housing has an open slot, and a length of the at least one door is equivalent to a length of the open slot.

* * * * *